United States Patent [19]

Pastor et al.

[11] 4,315,832

[45] Feb. 16, 1982

[54] PROCESS FOR INCREASING LASER CRYSTAL FLUORESCENCE YIELD BY CONTROLLED ATMOSPHERE PROCESSING

[75] Inventors: Ricardo C. Pastor, Manhattan Beach; Donald P. Devor, Woodland Hills, both of Calif.

[73] Assignee: Hughes Aircraft Company, Culver City, Calif.

[21] Appl. No.: 17,864

[22] Filed: Mar. 5, 1979

[51] Int. Cl.³ .................... C09K 11/46; C01F 17/00
[52] U.S. Cl. .......................... 252/301.4 R; 423/263; 423/21.1
[58] Field of Search .................. 252/301.16, 301.17, 252/301.4 R; 423/21, 263

[56] References Cited

U.S. PATENT DOCUMENTS

| | | | |
|---|---|---|---|
| 3,723,599 | 3/1973 | Brandle et al. | 423/263 |
| 4,013,501 | 3/1977 | Van Uitert et al. | 252/301.4 R X |
| 4,030,949 | 6/1977 | Horikoshi et al. | 148/171 |

FOREIGN PATENT DOCUMENTS

| | | |
|---|---|---|
| 1033391 | 6/1966 | United Kingdom . |
| 1164396 | 9/1969 | United Kingdom . |

OTHER PUBLICATIONS

Robbins et al., Physical Reviews, vol. 19, No. 2, pp. 1254–1269, Jan. 1979.
Robbins et al., J. Electrochem. Soc., vol. 126, No. 7, pp. 1221–1227, Jul. 1979.
Robbins et al., J. Electrochem. Soc., vol. 126, No. 9, pp. 1556–1563.

Primary Examiner—F. Edmundson
Attorney, Agent, or Firm—Mary E. Lachman; W. H. MacAllister

[57] ABSTRACT

The specification discloses a process for modifying the environment of active atoms in a selected material by removing impurities from the environment. The material is heated at an elevated temperature in an atmosphere conducive to the formation of atomic oxygen so that the atomic oxygen can react with the atoms and molecules in the environment to remove the impurities in and thus alter selected properties of the material. In a preferred embodiment of the present invention, the lasing efficiency of a neodymium-doped yttrium aluminum garnet crystal is increased by heating the crystal at an elevated temperature in an atmosphere conducive to the formation of atomic oxygen so that the atomic oxygen can react with and remove impurities from the crystal to diminish the color center concentration therein and thus increase the fluorescence yield and lasing efficiency of the crystal.

13 Claims, 5 Drawing Figures

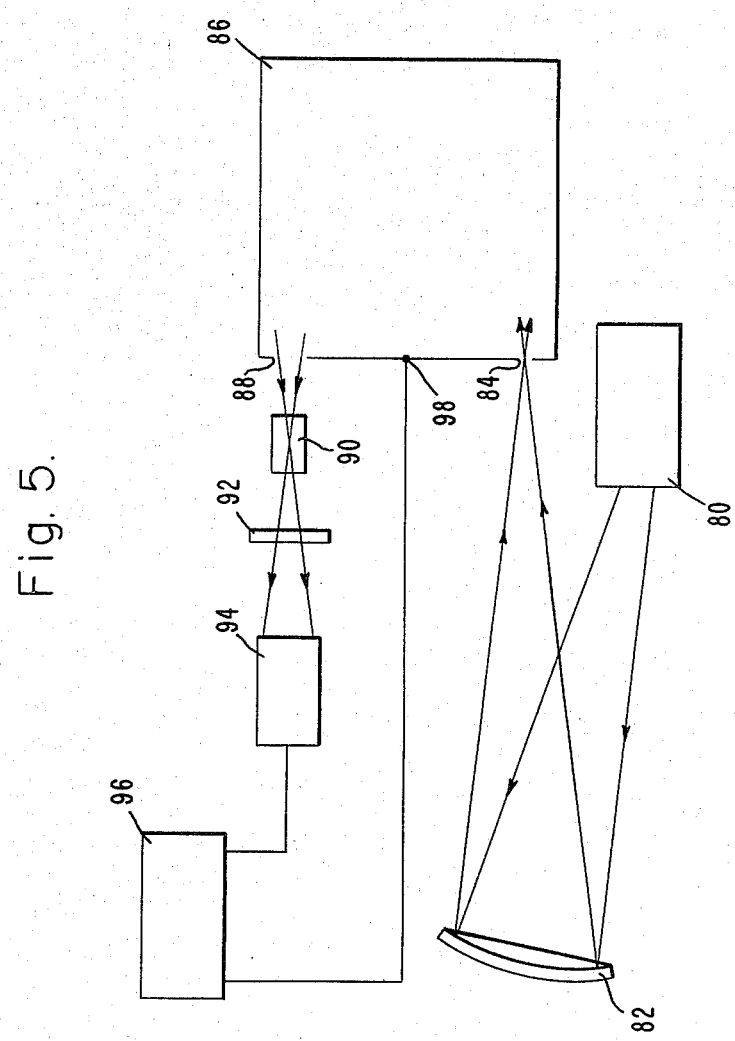

PROCESS FOR INCREASING LASER CRYSTAL FLUORESCENCE YIELD BY CONTROLLED ATMOSPHERE PROCESSING

FIELD OF THE INVENTION

This invention relates generally to the field of lasers and, more particularly, to a process for improving the lasing efficiency of a neodymium-doped yttrium aluminum garnet laser.

BACKGROUND OF THE INVENTION

In order to produce a laser beam, light is introduced into a host material which contains an active ingredient, to raise the atoms of the active ingredient to higher energy levels. When a number of these active atoms return to their original energy state, they do so in phase and produce radiation of the same frequency, thus producing a laser beam. The first laser action was produced using chromium as the active ingredient in a ruby host material. Later, lasing action was produced by neodymium contained in a glass host material. One system of current importance in laser technology uses an active ingredient of neodymium (Nd) and a host material of yttrium aluminum garnet (YAG), as discussed by A. E. Siegman in the book entitled "An Introduction to Lasers and Masers," McGraw-Hill Book Company, New York, 1971 and also in U.S. Pat. No. 4,013,501. Neodymium:YAG lasers are particularly useful for the application of optical methods to measure range, such as in range finders and in target designators and target illuminators.

One of the objectives of laser technology has been to increase the lasing efficiency or fluorescence yield of a laser so that the laser energy output can be maximized for a given input energy. Initial measurements by S. Singh, R. G. Smith and L. G. Van Uitert, in a publication entitled "Stimulated-emission cross section and fluorescent quantum efficiency of $Nd^{3+}$ in yttrium aluminum garnet at room temperature," *Physical Review B*, Vol. 10, No. 6, 15 Sept. 1974, pp. 2566–2572, indicated that the absolute radiative quantum efficiency of the $^4F_{3/2}$ state of $Nd^{3+}$ in YAG was 56 percent. Further work by S. Singh, W. A. Bonner, W. H. Grodkiewicz, M. Grasso, and L. G. Van Uitert, reported in a publication entitled "Nd-doped yttrium aluminum garnet with improved fluorescent lifetime of the $^4F_{3/2}$ state", *Applied Physics Letters*, Vol. 29, No. 6, 15 September 1976, pp. 343–345, aimed at improving the fluorescent lifetime of the metastable level of the laser transition, approached this problem by preparing Nd-doped YAG polycrystals in powdered form. Another approach to improving lasing efficiency was taken by J. W. Strozyk as described in a publication entitled "Lutetium effects on the UV absorption spectra of Nd:YAG", in *IEEE Journal of Quantum Electronics* (Correspondence), Vol. QE-7, Sept. 1971, pp. 467–469, where lutetium was used to promote the activity of the Nd atoms and thus improve lasing efficiency. Such an addition of certain metal ions to a laser material to improve lasing properties has been known in the art. For example, chromium ions have been added to a neodymium-doped laser material so that the chromium ions can absorb energy and transfer it to the neodymium ions, thereby permitting excitation of the neodymium ions over a wider energy band, as discussed by R. C. Ohlmann and R. Mazelsky, in the publication entitled "Energy transfer from $Cr^{3+}$ to $Nd^{3+}$ in solids" in *Physics of Quantum Electronics,* San Juan, Puerto Rico, McGraw-Hill, New York, 1966, pp. 322–331. In addition, it has been known that lasing efficiency can be improved by removing from the laser material metal ion impurities which quench the lasing action, as discussed by L. A. Riseberg and M. J. Weber, in "Relaxation phenomena in rare earth luminescence," in *Progress in Optics,* edited by E. Wolf, Elsevier North Ireland, New York, 1976.

SUMMARY OF THE INVENTION

The purpose of the present invention is to provide a new and improved process for modifying the environment of active atoms in a host material and thereby change certain properties of the material, particularly lasing properties.

In order to accomplish this purpose, we have discovered and developed a process for modifying the environment of active atoms in a selected material by removing impurities from the environment, by heating the material at an elevated temperature in an atmosphere conducive to the formation of atomic oxygen so that the atomic oxygen can react with the atoms and molecules in the environment to remove the impurities and thus alter selected properties of the material. More particularly, in a preferred embodiment of the present invention, the lasing efficiency of a neodymium-doped yttrium aluminum garnet crystal is increased by heating the crystal at an elevated temperature in an atmosphere conducive to the formation of atomic oxygen so that the atomic oxygen can react with and remove impurities from the crystal to diminish the color center concentration and thus increase the fluorescence yield and lasing efficiency of the crystal.

Accordingly, it is an object of the present invention to provide a new and improved process for modifying the environment of active atoms in a selected material to alter certain properties of the material, by heating the material in an atmosphere conducive to the formation of atomic oxygen.

Another object of the present invention is to provide a new and improved process for improving the efficiency of certain laser materials.

Still another object is to provide a new and improved process for removing interstitial or substitutional impurities from a crystal structure.

A further object is to provide a new and improved process for removing water-derived impurities from a neodymium-doped yttrium aluminum garnet crystal structure.

Another object is to provide a new and improved process for removing color centers from a crystal structure.

Another object is to provide a process of the type described which uses controlled atmosphere processing.

Yet another object of the present invention is to provide a new and improved laser crystal that has optimized lasing efficiency.

The foregoing and other objects and advantages of the present invention will be apparent from the following more particular description of the preferred embodiments of the invention, as illustrated in the accompanying drawings.

BRIEF DESCRIPTION OF THE DRAWINGS

FIG. 5 illustrates, in schematic form, an experimental test set-up used to measure the fluorescence excitation spectra of a Nd-doped YAG laser rod treated in accordance with the present invention.

DETAILED DESCRIPTION OF THE INVENTION

Figure 1:
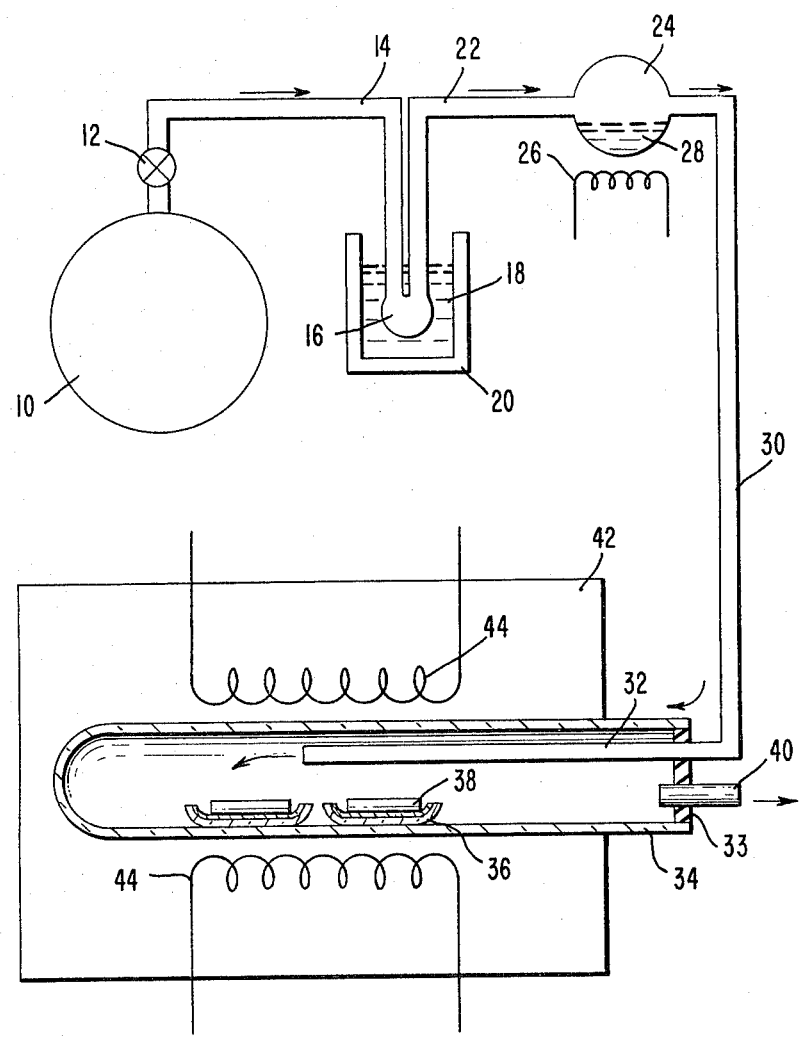
FIG. 1 illustrates, in schematic form, a preferred apparatus for carrying out the process of the present invention.

In FIG. 1 there is shown, in schematic form, a preferred apparatus for carrying out the present invention. High purity oxygen (99.99% pure) is provided in a container 10 which is connected to a valve 12, which is connected at its other end to the quartz or pyrex tubing 14. The tubing 14 is connected to a water trap device 16 that is immersed in a mixture of dry ice and acetone 18 in the container 20. The quartz or pyrex tubing 22 which emerges as shown from the exit of the water trap device 16 leads to a quartz or pyrex container 24 which holds iodine ($I_2$) initially in solid form. Upon activation of the heating element 26 which is located near the bottom of the container 24, the solid iodine forms the liquid 28 and is then vaporized. Optionally, the temperature in the container 24 may be controlled to produce sufficient vapor pressure directly from the solid iodine. The $I_2$ vapor mixed with the dried $O_2$ gas in the container 24 passes through the Teflon tube 30 to a connecting high purity (99.9%) alumina tube 32 which passes through a Teflon or vitreous silica cap 33 and then into a high purity alumina reaction tube 34.

Within the reaction tube 34 are one or more platinum-lined alumina boats 36 which contain the selected material 38 to be processed. The reaction tube 34 also has a high purity alumina tube 40 through which exhaust gases are removed from the reaction tube 34. The reaction tube 34 is contained within a furnace 42 which has heating elements 44 that can be controlled to raise the temperature in the furnace 42 to a predetermined level at which atomic oxygen is formed from the $O_2$ and $I_2$. The method of use of the apparatus shown in FIG. 1 is described below in Example 1.

The apparatus shown in FIG. 1 may be altered as required to accommodate the use of other atomic oxygen-producing substances, such as a mixture of iodine, oxygen and deuterium oxide; a mixture of iodine and water; nitrous oxide ($N_2O$); or molecular oxygen ($O_2$).

Figure 2:
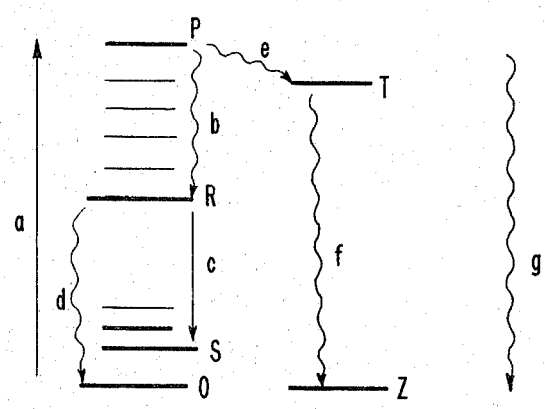
FIG. 2 illustrates, in schematic form, the energy level transitions of an excited Nd atom in a YAG laser host crystal.

Turning now to FIG. 2, there is shown in schematic form one possible explanation of the energy level transitions of an excited Nd atom in a YAG laser host crystal, with an energy level being indicated by a horizontal line. While the lasing action of Nd in YAG in particular is described, it is to be understood that this discussion applies equally to other lasing elements in other host materials. The Nd atom starts with an energy at level 0 shown in FIG. 2, and then light energy is introduced into the laser host crystal, which transfers energy to the Nd atom and raises its energy to the pumping level P, as indicated by transition "a" in FIG. 2. The Nd atom then relaxes to the metastable level R, as indicated by transition "b" in FIG. 2, by interaction with the YAG lattice, passing through several intermediate energy levels between levels P and R. This energy transition is non-radiative and occurs at a relatively fast rate. Then, the Nd atom undergoes a transition "c" indicated in FIG. 2, from level R to level S, which transition produces laser radiation of a specified wavelength (1.06 micrometers for Nd) and which occurs at a relatively slow rate. Optionally, some Nd atoms undergo transition "d" indicated in FIG. 2 from level R to level 0, which is a non-radiative transition. In addition, some Nd atoms can interact with impurity atoms in the YAG lattice and undergo non-radiative transitions such as transition "e" from level P to level T and then transition "f" from level T to level Z shown in FIG. 2. Non-radiative transitions such as these, caused by interaction of Nd atoms with impurities, decrease the lasing efficiency of the crystal since these interacted Nd atoms are thus not available to undergo the desired radiative transition. Consequently, by removing these impurities from the crystal lattice, the lasing efficiency of the laser host crystal can be increased.

In the case of a YAG crystal, during the crystal growth process, water vapor from the atmosphere can be incorporated within the crystal as is illustrated in and discussed below with reference to FIG. 3. These water-derived impurities have been found to react with the excited Nd atom at a level such as P and cause it to undergo a non-radiative transition directly to level 0, as indicated by transition "g" in FIG. 2. Thus, these Nd atoms cannot undergo a radiative transition. By the process of the present invention, the water-derived impurities are removed from the YAG crystal, thereby optimizing the radiative transitions and the lasing efficiency of the Nd atoms.

In addition, in practicing the present invention, a further, unexpected result has been discovered with respect to the fluorescence rate. The fluorescence rate is defined by the equation:

$$(1/Y) = (1/Y_o) + (1/Y_{NR})$$

where
  $1/Y$ = fluorescence rate
  $1/Y_o$ = radiative rate
  $1/Y_{NR}$ = non-radiative rate If the number of lasing transitions is increased, the value of the radiative rate would remain constant, and the fluorescence output would increase with no change in fluorescence rate, provided that the non-radiative rate did not change. However, if the non-radiative rate increased, the net effect expected would be to increase the fluorescence rate and to decrease the number of lasing transitions. On the contrary, in practicing the present invention, it has been found that while the fluorescence yield has been increased, the fluorescence rate does not change. Furthermore, there is no increase in the total number of $Nd^{3+}$ ions, as indicated by absorption spectra. This effect is indicative of the increased lasing efficiency attained by the present invention and represents a substantial improvement over the prior art processes previously discussed. In addition, the present invention has the advantage that a single-crystal rod can be purified without the remelting and crystal regrowth processes and their attendant difficulties, as practiced in prior art processes.

Figure 3:
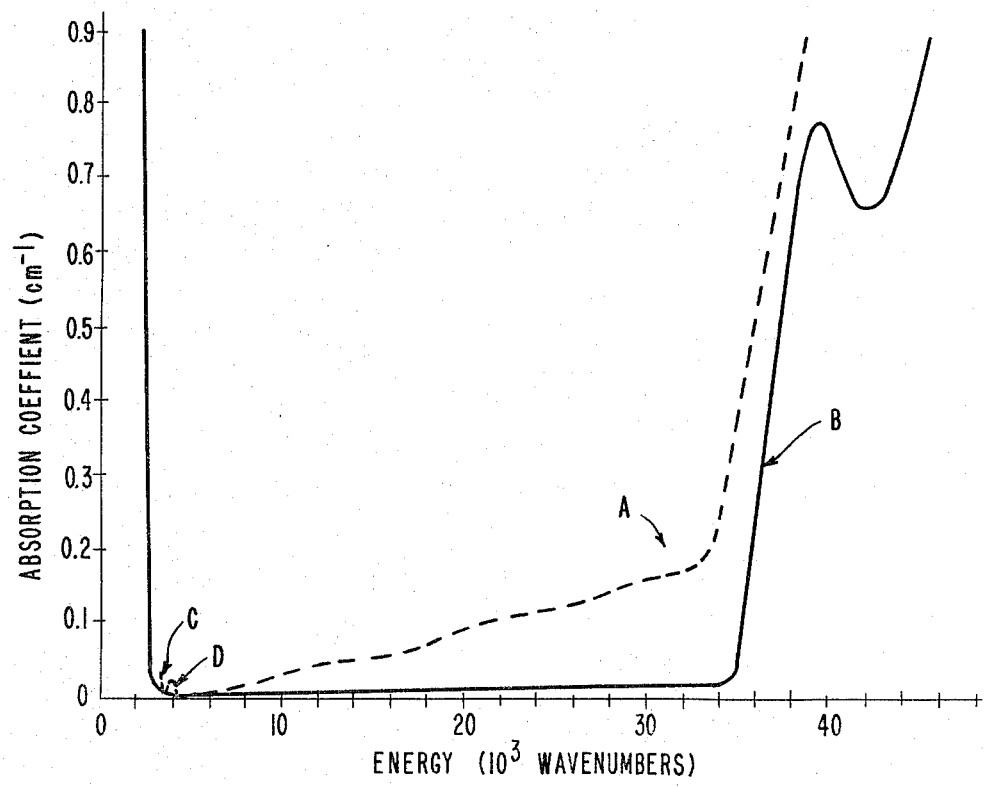
FIG. 3 presents a graph indicating the spectrographic absorption bands of an undoped YAG crystal both before and after processing in accordance with the present invention.

In FIG. 3 there is presented a graph which indicates the spectroscopic absorption bands of an undoped YAG crystal both before and after processing in accordance with the present invention. (An undoped YAG crystal was used so that the desired absorption bands would not be masked by the Nd electronic transitions.) The abscissa in FIG. 3 shows the absorbed light energy and the ordinate shows the absorption coefficient. Curve A in FIG. 3 shows the absorption bands of a commercially available YAG crystal, with the absorption at point C indicating a hydrogen bond and the absorption at point D indicating the presence of the water-like impurity believed to result from contamination during crystal growth. Curve B in FIG. 3 shows the absorption bands of the same undoped YAG crystal after being processed in accordance with the present invention, using iodine and oxygen. As can be seen in Curve B, absorption band D no longer appears, which indicates that the water-like impurity has been removed. This removal of the water-like impurity increases the fluorescence yield of a Nd-doped YAG crystal as discussed above with reference to FIG. 2. It has also been found that the process of the present invention decreases the color center of the YAG crystal, i.e. a color change caused by trapped electrons. Color centers are described more fully by A. E. Hughes and B. Henderson, in the publication entitled "Color Centers in Simple Oxides," in *Point Defects in Solids*, edited by J. H. Crawford and L. M. Slifkin, Plenum Press, New York, 1972, pp. 381–484. This decreased color center effect is indicated in FIG. 3 by the absence of the hydrogen absorption band C in curve B. If the color center, an electron, is removed, the proton which compensates its charge is no longer needed, and thus the hydrogen absorption band is not present.

Figure 4:
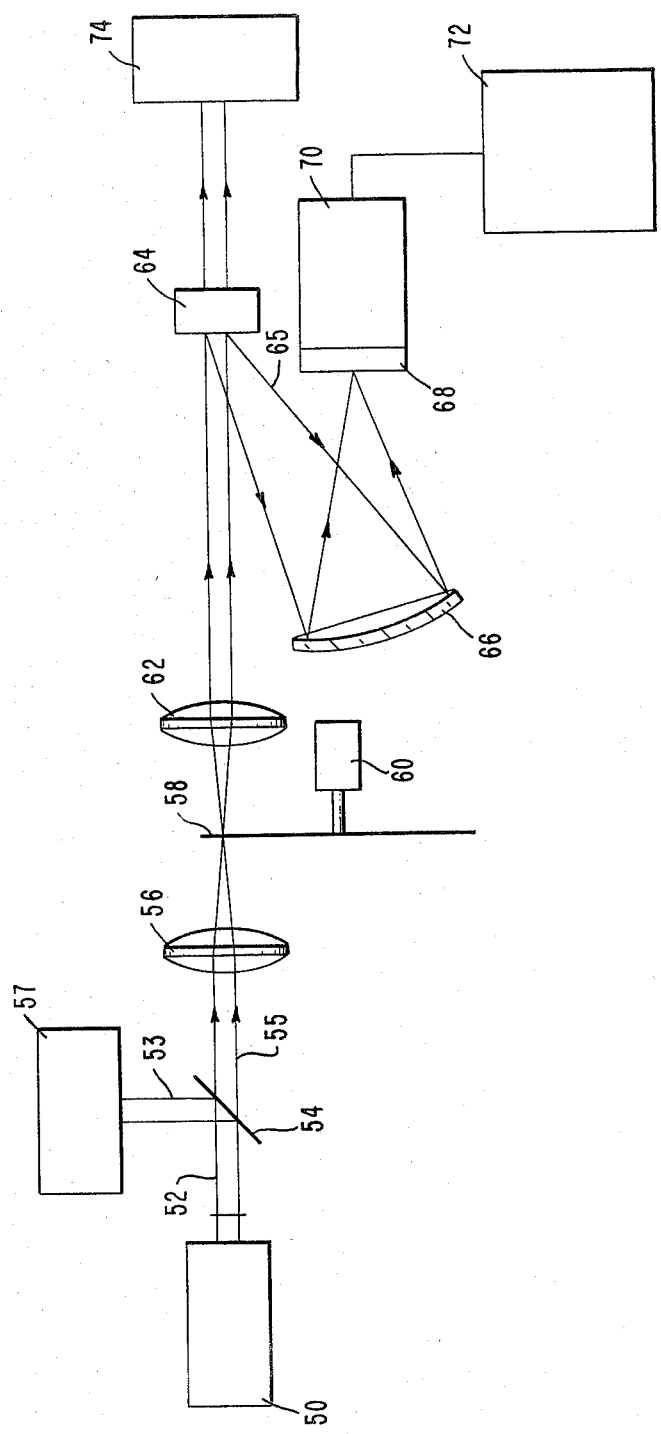
FIG. 4 illustrates, in schematic form, an experimental test set-up used to measure the fluorescence yield of a Nd-doped YAG laser rod treated in accordance with the present invention.

Turning now to FIG. 4, there is shown, in schematic form, an experimental test set-up which was used to measure the fluorescence yield of a Nd-doped YAG laser rod treated in accordance with the present invention. An argon laser 50 produces a 514.5 nanometer (nm) output beam 52 which is stabilized by an internal etalon and power feedback network. The beam 52 strikes the beam splitter 54, to split the beam into the portions 53 and 55. The beam portion 53 strikes the thermopile 57 which measures the 514.5 nm power incident on the Nd-doped YAG sample 64. The beam portion 55 passes through the focusing lens 56 whereby the beam 55 is focused to a point in the plane of blade 58 of a motor driven chopper 60, which turns the beam 55 on and off, to provide a means to measure the fluorescence rise and decay rates. Next, the focused beam passes through a collimating lens 62 and then strikes the Nd-doped YAG laser rod sample 64. The laser beam striking the Nd:YAG sample 64 causes the sample 64 to produce fluorescent rays 65 which are collected by the spherical mirror 66, having a 0.25 meter radius. The mirror 66 reflects the fluorescent rays and images them on an interference filter 68 which passes 1.06 micrometer radiation. The radiation passed by filter 68 strikes the S-1 surface photomultiplier tube 70, which produces an output signal that is measured by an oscilloscope 72. A portion of the laser beam which strikes the Nd:YAG sample 64 is transmitted thereby and detected by the thermopile 74. The use of the test set-up of FIG. 4 and the results obtained are described in Example 1.

In FIG. 5 there is shown an experimental test setup used to measure the fluorescence excitation spectra of the Nd-doped YAG laser rod treated in accordance with the present invention. A standard lamp of known spectral irradiance or other suitable illuminator 80 provides radiation which is collected by the imaging mirror 82 and reflected onto the entrance slit 84 of a monochromator 86 having a 1 meter focal length (for example, a Czerny-Turner monochromator). The Nd:YAG sample 90 is located at the exit slit 88 of the monochromator 86. A silicon filter 92 which transmits infrared radiation and absorbs monochromator radiation that is not absorbed by the sample 90, is placed between the sample 90 and an infrared detector 94. The infrared detector 94 provides an amplitude input to an oscillograph 96. A wavelength input to the oscillograph 96 is provided from the monochromator grating drive 98. This test set-up functions as follows. The radiation from source 80 enters the monochromator 86 at slit 84 and is processed by the monochromator 86 to provide a fluorescence excitation radiation which leaves the monochromator 86 through slit 88. This excitation radiation strikes the Nd:YAG sample 90 and causes it to fluoresce. The fluorescent radiation from sample 90 passes through the silicon filter 92 and strikes the infrared detector 94, which produces a signal input to the oscillograph 96 that is indicative of the amplitude of the fluorescence transitions of the sample 90. A signal that is indicative of the wavelength of the excitation radiation is derived from the grating drive 98 of the monochromator 86 and is provided as an input to the oscillograph 96. Thus, an oscillograph recording may be prepared which plots amplitude of fluorescence versus wavelength of excitation radiation. The results obtained from using this test set-up with the Nd:YAG sample processed in accordance with the present invention are presented in Example 1.

EXAMPLE 1

This example illustrates the use of the apparatus described in FIG. 1 in order to carry out the process of the present invention. Two Nd-doped YAG laser rods 38, shown in FIG. 1, 3 inches long and 0.25 inches in diameter, doped to a concentration of one atomic percent were placed in individual platinum-lined alumina boats 36. The boats 36 were placed in the reaction tube 34, which was then sealed and placed in the furnace 42. The heating elements 44, which were silicon carbide rods, were activated by applying a controlled voltage thereto, and the temperature of the furnace was raised to 1500° C. One effect of the elevated temperature is to increase the mobility of the impurities in the rods. High purity $O_2$ was introduced from the container 10 through the valve 12 at a flow rate of 6 to 7 cubic centimeters per minute into the cold trap 16, where residual water was removed from the $O_2$ by freezing in the dry ice-/acetone mixture 18. The dried $O_2$ was then passed into the container 24 containing iodine vapor. The iodine vapor had been produced by activating the heating element 26, which was a nichrome wire, by applying a controlled voltage to this wire, to raise the temperature in the container 24 to approximately 100° C. to vaporize the $I_2$. The mixture of dry $O_2$ and $I_2$ had mole concentrations in the ratio of 10:1. The $O_2$ and $I_2$ mixture then passed through tubes 30 and 32 into the reaction tube 34. At the elevated temperature in the reaction tube (approximately 1500° C.), the $O_2$ and $I_2$ reacted to produce an atmosphere conductive to the formation of atomic oxygen, which surrounded and reacted with the laser rods 38.

Using the test set-up described for FIG. 4, the fluorescence yield of the Nd-doped YAG rod treated in accordance with the present invention as described above, was measured relative to a standard Nd:YAG laser rod. First, the standard Nd:YAG laser rod was placed in position 64 shown in FIG. 4. The argon laser 50 was activated and the oscilloscope display of the photomultiplier output was measured. The fluorescence yield was determined by measuring the peak amplitude of the waveform displayed on the oscilloscope. (Fluorescence excitation and decay time dependence were also observed from the oscilloscope display.) Next, the standard Nd:YAG laser rod was removed and an unprocessed Nd:YAG rod was placed in position 64 shown in FIG. 4. The argon laser 50 was activated and the peak amplitude of the waveform displayed on the oscilloscope was determined and compared to that of the standard Nd:YAG rod. Then, after the Nd:YAG rod had been processed in accordance with the present invention, it was placed in position 64 shown in FIG. 4. The argon laser 50 was activated and the peak amplitude of the waveform displayed on the oscilloscope was determined and compared to that of the standard Nd:YAG rod. The doped YAG rod processed for a total of 60 hours in accordance with the present invention, registered a monotonic increase in the 1.06 micrometer fluorescence yield, eventually settling to a 35 percent increase over the value prior to processing, as measured relative to the standard Nd:YAG rod. The reproducible accuracy of these measurements is 0.5 percent. In addition, the absolute fluorescence efficiency of the Nd:YAG sample can be detected by calibrating the photomultiplier tube and taking into consideration the spectral efficiency of the interference filter and the geometrical optics effects.

Using the test set-up and method described for FIG. 5, the fluorescence excitation spectra of the Nd-doped YAG rod treated in accordance with the present invention as described above, was measured and showed that the improved fluorescence yield is characteristic of all fluorescence excitation levels, i.e., the $Nd^{3+}$ electronic levels with energies equal to or higher than the $^4F_{3/2}$ metastable level of the 1.06 micrometer laser transition. The fluorescence transitions detected were:

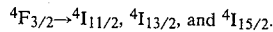

The detected fluorescence varied as the product of the excitation level absorption coefficient and the efficiency for the conversion of absorbed energy to fluorescence emission. Other factors such as the monochromator spectral transmission efficiency and detector spectral sensitivity, which may be calibrated, are invariant parameters in the measurement. A comparison of the absorption spectra and the fluorescence excitation spectra prior to and after processing indicated the improvement in the fluorescence excitation spectral efficiency which was brought about by processing in accordance with the present invention.

EXAMPLE 2

A Nd-doped $YAlO_3$ (YALO) laser rod was processed in accordance with the present invention in a manner similar to that described in Example 1. Using the same measurement procedure as described in Example 1, the fluorescence yield of the processed rod at 1.06 micrometers was determined to be increased by 4 percent over that of the same rod before processing.

EXAMPLE 3

A Nd-doped $Gd_3Ga_5O_{12}$ (GGG) laser rod was processed in accordance with the present invention in a manner similar to that described in Example 1. Using the same measurement procedure as described in Example 1, the fluorescence yield of the processed rod at 1.06 micrometers was determined to be increased by 35 percent over that of the same rod before processing.

EXAMPLE 4

A Nd-doped $YVO_4$ laser rod was processed in accordance with the present invention in a manner similar to that described in Example 1. Using the same measurement procedure as described in Example 1, the fluorescence yield of the processed rod at 1.06 micrometers was determined to be increased by 19 percent over that of the same rod before processing.

EXAMPLE 5

A Nd-doped $Y_2O_3$ laser rod was processed in accordance with the present invention in a manner similar to that described in Example 1. Using the same measurement procedure as described in Example 1, the fluorescence yield of the processed rod at 1.06 micrometers was determined to be increased by 14 percent over that of the same rod before processing.

While the present invention has been particularly described with respect to the preferred embodiments thereof, it will be recognized by those skilled in the art that certain modifications in form and detail may be made without departing from the spirit and scope of the invention. In particular, the scope of the invention is not limited to Nd-doped YAG crystals, but is intended to include other lasing elements, such as rare earth elements and other oxide crystals and glass host materials, such as yttrium aluminum oxide ($YAlO_3$), gadolinium gallium garnet ($Gd_3Ga_5O_{12}$), yttrium vanadium oxide ($YVO_4$), and yttrium oxide ($Y_2O_3$). Furthermore, the scope of the invention is not limited to improving lasing efficiency, but also includes improving the fluorescence yield of various materials with various dopants, including phosphors, as well as causing changes in properties which can be brought about by the reaction of a chosen material with atomic oxygen. It is also expected that by removing color centers from the host crystal, the process of the present invention should be effective in post-growth upgrading of an electro-optical crystal such as lithium niobate, by increasing its resistance to laser damage. In addition, while the present invention has been described with respect to single-crystal material, the above-described process may be carried out using polycrystalline material as well. Furthermore, it is anticipated that the process of the present invention may be applied during, as well as after, crystal growth, since the chemistry applicable at a temperature just below the crystal melting point as set forth herein, should apply as well at the melting point or even higher temperatures as may be used in various crystal growth processes.

What is claimed is:

1. A process for modifying the environment of active atoms in a selected material by removing selected impurities from said environment, said impurities being selected from the group consisting of water and water-derived impurities and being substitutionally or interstitially incorporated in said material, which comprises heating said material at a predetermined elevated temperature in an atmosphere conducive to the formation of atomic oxygen for a period of time sufficient to enable said atomic oxygen to react with the atoms and molecules in said environment to thereby remove said impurities and alter selected properties of said material.

2. The process as set forth in claim 1 wherein said selected material is an insulating material.

3. The process as set forth in claim 1 wherein said heating is performed at 1500° C. or higher in a vapor mixture of oxygen and iodine having mole concentrations in the ratio of 10:1 and which is conducive to the formation of said atomic oxygen.

4. The process as set forth in claim 1 wherein said heating is performed at 1500° C. or higher in a vapor mixture of predetermined amounts of iodine, oxygen, and deuterium oxide, which is conducive to the formation of said atomic oxygen.

5. The process as set forth in claim 1 wherein said heating is performed at 1500° C. or higher in a vapor mixture of predetermined amounts of iodine and water, which is conducive to the formation of said atomic oxygen.

6. The process as set forth in claim 1 wherein said heating is performed at 1500° C. or higher in a vapor of nitrous oxide, which is conducive to the formation of said atomic oxygen.

7. The process as set forth in claim 1 wherein said heating is performed at 1500° C. or higher in an atmosphere of molecular oxygen, which is conducive to the formation of said atomic oxygen.

8. A process for increasing the lasing efficiency of a selected oxide laser material by removing selected impurities therein, said impurities being selected from the group consisting of water and water-derived impurities and being substitutionally or interstitially incorporated in said material, which comprises heating said material at a predetermined elevated temperature in an atmosphere conducive to the formation of atomic oxygen for a period of time sufficient to enable said atomic oxygen to react with and remove said impurities and to thereby increase said lasing efficiency.

9. A process for increasing the lasing efficiency of a Nd-doped laser host crystal selected from the group consisting of $Y_3Al_5O_{12}$ (YAG), $YAlO_3$ (YALO), $Gd_3Ga_5O_{12}$ (GGG), $YVO_4$, and $Y_2O_3$, by diminishing the color center concentration therein, which comprises heating said crystal at a predetermined elevated temperature in an atmosphere conducive to the formation of atomic oxygen for a period of time sufficient to enable said atomic oxygen to react with and remove selected impurities from said crystal to diminish said color center concentration herein and thereby increase the fluorescence yield and lasing efficiency of said crystal.

10. A process for increasing the lasing efficiency of Nd-doped yttrium aluminum garnet (YAG) crystals which comprises heating said crystals at 1500° C. or higher in a vapor mixture of chosen amounts of oxygen and iodine, which is conducive to the formation of atomic oxygen, for a period of time sufficient to enable said atomic oxygen to react with and remove water-derived impurities from said crystals and thereby increase the 1.06 micrometer fluorescence yield and lasing efficiency of said crystals.

11. A process for increasing the lasing efficiency of a Nd-doped laser host crystal selected from the group consisting of $Y_3Al_5O_{12}$ (YAG), $YAlO_3$ (YALO), $Gd_3Ga_5O_{12}$ (GGG), $YVO_4$, and $Y_2O_3$ which comprises heating said crystal to a predetermined elevated temperature while exposing said crystal to atomic oxygen for a period of time sufficient to enable said atomic oxygen to react with and remove water-derived impurities from said crystal and thereby increase the 1.06 micrometer fluorescence yield and lasing efficiency of said crystal.

12. A Nd-doped laser host crystal selected from the group consisting of $Y_3Al_5O_{12}$, $YAlO_3$, $Gd_3Ga_5O_{12}$, $YVO_4$, and $Y_2O_3$ having optimized lasing efficiency, formed by heating said crystal at a predetermined elevated temperature in an atmosphere conducive to the formation of atomic oxygen for a period of time sufficient to enable said atomic oxygen to react with and remove selected impurities from said crystal and thereby increase the fluorescence yield and lasing efficiency of said crystal.

13. A Nd-doped laser host crystal selected from the group consisting of $Y_3Al_5O_{12}$, $YAlO_3$, $Gd_3Ga_5O_{12}$, $YVO_4$, and $Y_2O_3$, having optimized lasing efficiency, formed by heating said crystal to a predetermined elevated temperature while exposing said crystal to atomic oxygen for a period of time sufficient to enable said atomic oxygen to react with and remove water-derived impurities from said crystal and thereby increase the 1.06 micrometer fluorescence yield and lasing efficiency of said crystal.

* * * * *